US006668333B1

(12) United States Patent
Demir et al.

(10) Patent No.: US 6,668,333 B1
(45) Date of Patent: Dec. 23, 2003

(54) METHOD AND APPARATUS FOR EVALUATING EFFECTS OF SWITCHING NOISE IN DIGITAL AND ANALOG CIRCUITRY

(75) Inventors: Alper Demir, Jersey City, NJ (US); Peter Feldman, Short Hills, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/515,490

(22) Filed: Feb. 29, 2000

(51) Int. Cl.[7] ............................................... G06F 1/04
(52) U.S. Cl. ........................................ 713/500; 375/227
(58) Field of Search ................................. 713/500, 501, 713/600; 716/4, 5, 18; 375/227

(56) References Cited

U.S. PATENT DOCUMENTS

| | | | | | |
|---|---|---|---|---|---|
| 5,510,698 A | * | 4/1996 | Stankovic et al. | .......... | 323/282 |
| 5,596,570 A | * | 1/1997 | Soliman | ...................... | 370/252 |
| 6,138,267 A | * | 10/2000 | Murai | ............................. | 716/5 |
| 6,237,126 B1 | * | 5/2001 | Bonitz | ............................. | 716/4 |
| 6,259,389 B1 | * | 7/2001 | McGrath | ..................... | 341/120 |
| 6,279,142 B1 | * | 8/2001 | Bowen et al. | .................. | 716/5 |
| 6,438,733 B1 | * | 8/2002 | Clement | ......................... | 716/4 |

\* cited by examiner

*Primary Examiner*—Dennis M. Butler
(74) *Attorney, Agent, or Firm*—Jean-Marc Zimmerman

(57) ABSTRACT

The present invention is for a method and apparatus for analyzing the effect of a plurality of noise sources in a circuit, wherein each one of the noise sources is associated with a discrete stochastic process defined on a state-set of Markov chains. Each discrete stochastic process is modulated with a set of continuous signals that represents the noise generated by the corresponding noise source at each noise generating event. A spectral power density of the signals resulting from the modulation is computed and transferred through a linear system that represents a platform that supports the circuit. The output of the linear system comprises the spectral power density of interference signals at the points of interest and their correlations.

23 Claims, 3 Drawing Sheets

METHOD AND APPARATUS FOR EVALUATING EFFECTS OF SWITCHING NOISE IN DIGITAL AND ANALOG CIRCUITRY

FIELD OF THE INVENTION

This invention relates to circuit analysis, and more particularly to evaluating the effect of interference noise generated by switching elements at points of interest in a circuit comprised of both digital and analog components.

BACKGROUND OF THE INVENTION

Increasing numbers of circuit components are built on the same silicon substrate. Inevitably, some of the circuit components include sensitive analog and RF circuits, the performance which can be significantly degraded by the presence of interference signals. In a circuit comprised of both digital and analog components implemented on the same silicon substrate, the switching of the digital gates constitutes a significant source of interference noise, which propagate through, for example, the power supply grid, the silicon substratum signal wires and package pins.

Most of conventional analysis tools use traces from logic simulation to model the switching activity of digital gates. For example, a conventional method uses an inverter chain to model the digital switching activity. The digital signals are converted to time domain, and transient simulation is used to obtain the time-domain interference signal at points of interest. Another conventional approach has been to use logic simulation together with cell-library characterization. The individual contributions are combined at the output node into a long time-domain waveform. The corresponding power spectrum is estimated from this long time-domain waveform using standard techniques.

The conventional methods suffer from significant drawbacks. First, important features of the power spectrum are lost when spectral estimation is performed on time-domain sequences. Another disadvantage is the difficulty of incorporating nontrivial effects from the substrate and the power-ground grid. The substrate is assumed to be purely resistive, and the parasitics of the on-chip digital power-ground grid are usually ignored.

SUMMARY

We have developed in accordance with the principles of the invention a method and apparatus for analyzing noise generated by switching elements in a circuit comprised of digital and analog components, wherein each switching element is associated with a random and discrete sequence of switching events having a plurality of possible values. Each one of the random and discrete sequences is modulated at each switching event with a set of continuous signals that represents the actual current injected by the corresponding switching element into the circuit. A spectral power density of the signals resulting from the modulation is transferred through a linear system that models the ensemble of power and ground wires, the substrate, the IC package, and the circuit board. The output of the linear system comprises the spectral power density of the interference signals at the points of interest.

DETAILED DESCRIPTION OF THE INVENTION

The present invention uses modulated stochastic switching activity propagation (MSSAP) to analyze the effect of the interference noise generated by millions of switching gates at points of interest in an IC. The points of interest will generally be certain critical nodes that host sensitive analog circuitry.

Figure 2:
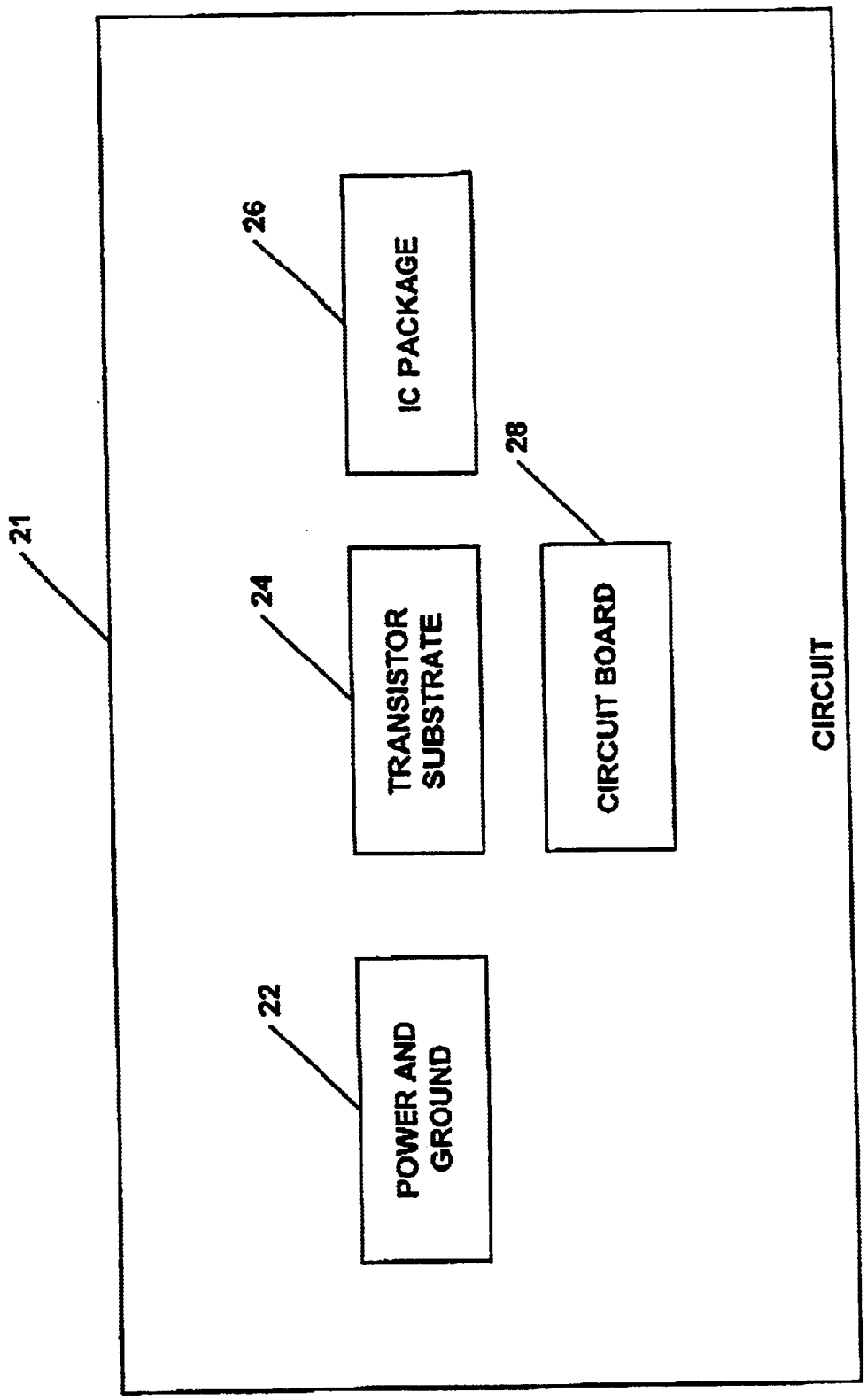
FIG. 2 shows a model of a linear circuit.

The present invention performs a frequency domain based anualysis and outputs a power spectral density of the interference signals at the points of interest to help engineers in making system and circuit design decisions. The present invention uses the following approximations to analyze the effect of such interference:

(a) the contribution of each switching gate is treated as ideal sources that model the currents injected or sinked from the power grid and substrate as the gate switches;

(b) the switching pattern of each gate is modeled as a stochastic process that approximates the gate's switching statistics;

(c) the ensemble of power, ground 22, transistor substrate 24, IC package 26, and board 28 is treated as a linear circuit 21, and is modeled using conventional extraction tools, as shown in FIG. 2.

These approximations reduce the problem of evaluating the effect of millions of switching gates at points of interest as a problem of evaluating stochastic processes, as they propagate through a linear system. The quantity of interest is the spectral power density $S_{yy}(f)$ of the interference signals at the points of interest. $S_{yy}(f)$ is a matrix, wherein the quantities on the matrix diagonal represent the spectral power density of the interference signal at each point of interest. The off-diagonal quantities represent correlations between the interference signals. $S_{yy}(f)$ is a function of the input cross-spectral power density matrix $S_{xx}(f)$ and the linear system's transfer function $H(j2pf)$ defined as $S_{yy}(f)=H(j2pf)S_{xx}(f)H^*(j2pf)$, where the superscript * denotes the complex conjugation of H.

The input cross-spectral power density matrix $S_{xx}(f)$ is a square matrix that contains signal statistics for all interference sources. The size of the matrix is proportional to the number of the switching gates. The diagonal matrix-elements represent the spectrum of interference noise generated by each switching gate, and the off-diagonal elements represent correlations between the gates. Strong correlations tend to be localized within the same logic function. Thus, in general, $S_{xx}$ will be mainly block-diagonal with relatively small blocks.

The matrix-transfer function $H(j2pf)$ models the ensemble of power, ground 22, substrate 24, package 26, and board 28 as a multi-input and multi-output linear system. The number of inputs is equal to the number of interference sources. The number of outputs is equal to the number of the points of interest. The input cross-spectral power density matrix $S_{xx}(f)$ is obtained using modulation theory. Each switching gate is associated with a random, discrete, four valued signal, c[n], that models its transitions: high-high, high-low, low-high, and low-low. Each of the four possible values of c[n] 11 is assigned with a different set of continuous waveforms $g^{c[n]}(t)$ 12, 13, 14 and 15 representing the actual currents that the gate injects into the power, ground and substrate system during the corresponding transition. At each switching event, c[n] is modulated with the corresponding set of continuous waveforms $g^{c[n]}(t)$ 12, 13, 14 and 15. The result of the modulation x(t) 16 represents the continuous signals injected by a switching gate into the ensemble of power, ground 22, transistor substrate 24, IC package 26 and board 28, where x(t) is defined as $x(t) = ?_{n=-8}^{8} g^{c[n]}(t-nT)$ and T represents the clock period.

Figure 1:
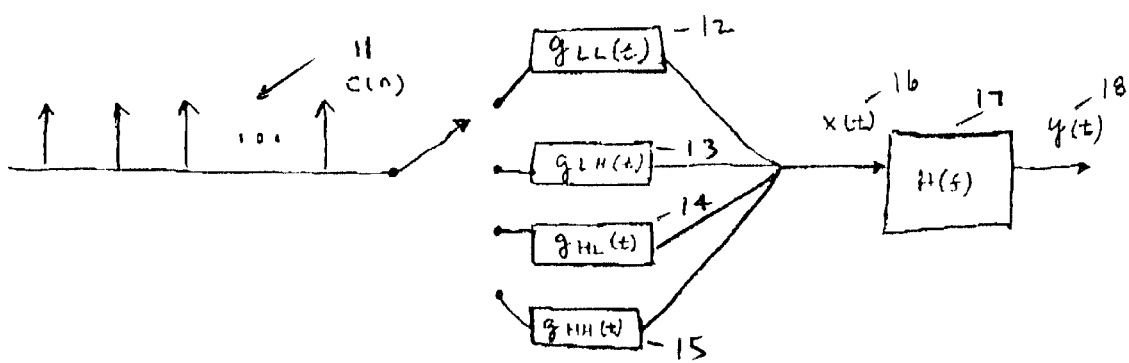
FIG. 1 shows an exemplary illustration of how the present invention analogizes the propagation of interference noise from switching elements to modulation in digital communication.
Figure 3:
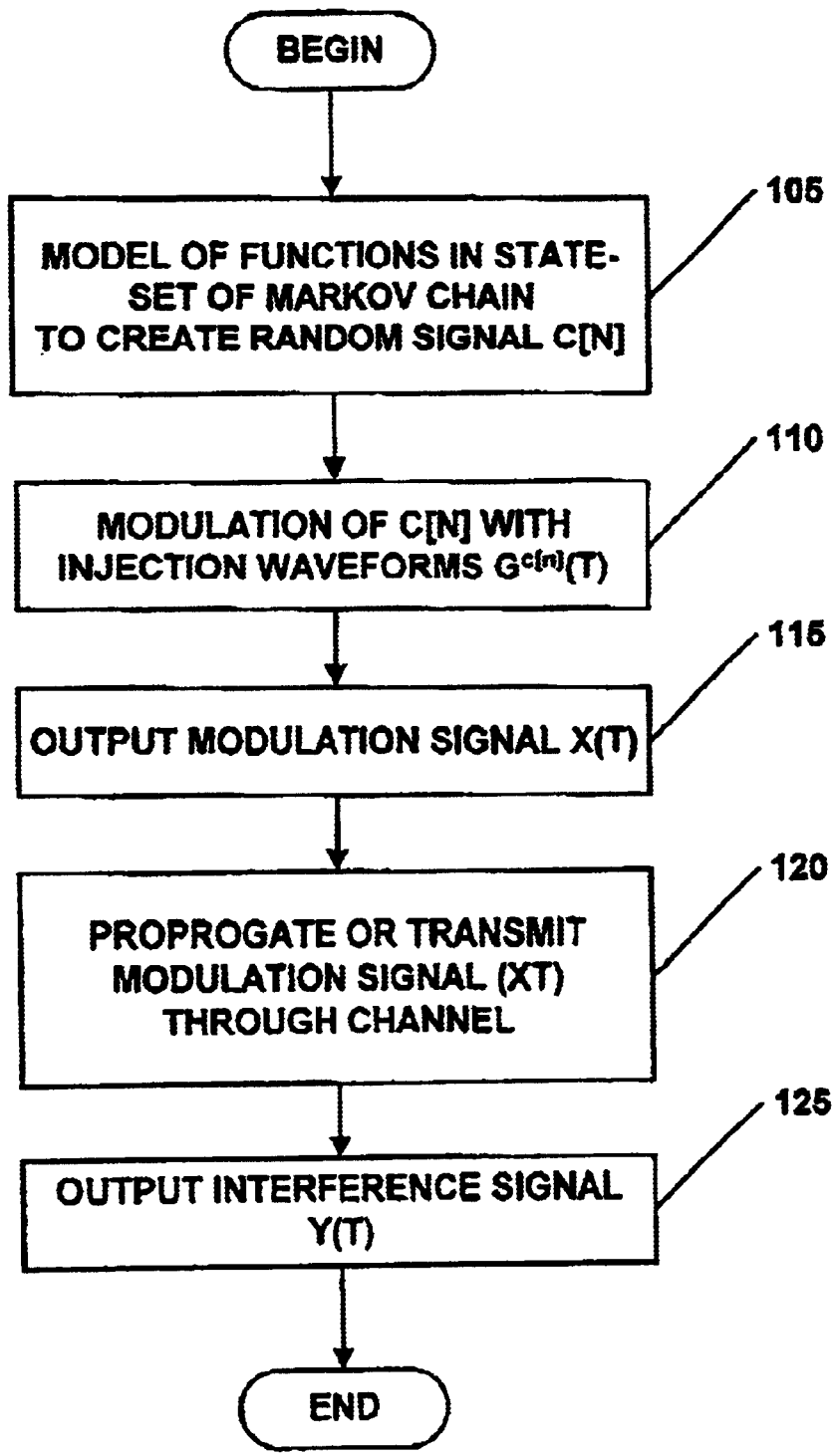
FIG. 3 shows a general flowchart of the process for evaluating a plurality of noise sources in a circuit.

FIG. 1 and FIG. 3 show how the present invention analogizes the problem of solving the effect of interference noise generated by millions of switching gates to modulation in digital communications. In a signal propagation channel 10, an encoded signal c(n), 11, is transmitted. C[n] has four possible values, and depending on the value of c[n], one set of continuous waveforms, 12, 13, 14 or 15, is used to modulate c(n) 11, at step 110. At Steps 115 and 120, the modulation x(t) 16 is output and the output of the modulation x(t), 16, propagates through channel 17, which represents the ensemble of the power, ground 22, transistor substrate 24, IC package 26 and board 28. The output of channel 17 is the interference signal y(t), 18 which is output at Step 125.

At step 105, the random signal c[n] 11 is modeled by functions defined on the state-set of Markov chains (MCs). The MC is characterized by a state set $Z=\{s_1 \ldots, s_l\}$ and a 1×1 state transition probability matrix (TPM) P. The digital transition signal is defined as a function h: $Z \rightarrow \{LL, LH, HL, HH\}$ represented by a 1×1 column vector $d=\{h(s_1) \ldots, h(s_l)\}^T$. For example, for a 2-input NAND gate and a 2-input NOR gate that share the same digital input signals A and B, the outputs of the NAND and NOR gates are digital signals C and D, respectively.

The digital input signals A and B are modeled as $\{0, 1\}$-valued stochastic processes $d_A[n]$ and $d_B[n]$ defined as functions on two statistically independent, two-state MCs $z_A[n]$ and $z_B[n]$ with state sets $Z_A=\{s_{A1}, s_{A2}\}$ and $Z_B=\{s_{B1}, s_{B2}\}$, respectively, having the following TPMs:

$$P_A = \begin{bmatrix} 1-a_A & a_A \\ b_A & 1-b_A \end{bmatrix}$$

$$P_B = \begin{bmatrix} 1-a_B & a_B \\ b_B & 1-b_B \end{bmatrix}$$

where $a_A$ represents the probability of the digital signal A will switch from low to high, and $b_A$ represents the probability of the digital signal A will switch from high to low. Similarly, $a_B$ and $b_B$ represent the probabilities that the digital signal B will switch from low to high, and high to low, respectively.

The digital output signals C and D are modeled as stochastic processes $d_C[n]$ and $d_D[n]$. A four-state MC $z_{CD}[n]$ with the state Set $Z_{CD}=\{s_{CD1}, s_{CD2}, s_{CD3}, s_{CD4}\} = \{\{s_{A1}, s_{B1}\}, \{s_{A1}, s_{B2}\}, \{s_{A2}, s_{B1}\}, \{s_{A2}, s_{B2}\}\}$ having TPM $P_{CD}=P_A(x)P_B$ where (x) denotes the Kronecker product for matrices, define $d_{C[n]\ and\ dD}[n]$ as follows:

$d_C=h_C(Z_{CD})=[1,1,1,0]\ d_D=b_D(Z_{CD})=[1,0,0,0]$.

The input stochastic processes $d_A[n]$ and $d_B[n]$ can be defined as functions on the four-state MC $z_{CD}[n]$ as follows:

$d^e_A=h^e_A(Z_{CD})=[0,0,1,1]\ d^e_B=h^e_B(Z_{CD})=[0,1,0,1]$ where the superscript "e" stands for "expanded" to differentiate the functions and vectors on the four-sate chain from the ones that were defined on the 2-state MCs. Accordingly, the outputs of the NAND and NOR gates represented as vectors $d_C[n]$ and $d_D[n]$ are functions of $d^e_A$ and $d^e_B$, wherein $d_C$=NOT $((d^e_A$ AND $d^e_B))$, $d_D$=NOT $((d^e_A$ OR $d^e_B))$, and where AND and OR operate on the vectors $d_C[n]$ and $d_D[n]$ element-wise. Thus, the four-state MC $z_{CD}[N]$ along with the functions $d^e_A$ and $d^e_B$ and $d_C[n]$ and $d_D[n]$ represent the inputs and the outputs of the logic circuit comprised of the NAND and the NOR gate.

Correlations between digital signals A, B, C, and D are represented as they are modeled on the same underlying MC. Specifically, the output of the NAND gate and the NOR gate are correlated if the signal at the output of the NOR gate has value 1 during a clock interval, the NAND gate output has to be also 1. The foregoing example can be generalized for an arbitrary combinational circuit having any number of inputs and outputs. All signals of any such combinational circuit can he represented on a MC obtained from the MCs of the primary inputs. This modeling process captures both the individual switching statistics of all signals and their correlations.

The sizes of the vectors that define the digital signals and the TPMs that define the MCs grow exponentially with the number of inputs to a logic circuit. The vectors and matrices are efficiently manipulated exploiting their special structure and efficient data structures similar to binary decision diagrams (BDDs). Typically, each switching event in the random sequence c[n] 11 is associated with noise source signals, such as injection current patterns for the power, ground, and substrate. In a cell-based design environment the injection patterns are determined off-line and are stored in parameterized form during the library characterization procedure. The injection-current waveforms stored in the library are time-referenced from the clock transition time.

At step 110, the continuous-time stochastic process x(t) 16 models the signal injected by a switching gate and the discrete-time stochastic process, c|n| 11, takes values in $Q=\{LL, LH, HL, HH\}$ such that for every digital signal, there is a set of four injection waveforms $g^{LL}(t)$, $g^{LH}(t)$, $g^{HL}(t)$ and $g^{HH}(t)$. For example, for M switching gates $x_1(t), \ldots, x_M(t)$ associated with M discrete stochastic processes $c_j(n), \ldots, c_M(n)$, all of which are modeled as functions on the same MC with the state set $Z=\{s_1, \ldots, s_1\}$, the digital transition signal $h_m$: $Z \rightarrow Q=\{LL, LH, HL, HH\}$, m=1, ..., M defines $c_m[n]$, m=1, ..., M on the MC.

For a complete spectral characterization, $S_{xx}$ is computed for the M×1 vector stochastic process, $x(t)=\{x_1(t), \ldots, x_M(t)\}^T$, where the function $g_m(t:S_j)$ and a corresponding M×1 matrix function g(t) are defined, respectively, as follows:

$$g_m(t:s_i) = g_m^{bM(\sigma i)}(t) \text{ where, } m = 1, \ldots, M, \text{ and } i = 1, \ldots, 1, \text{ and}$$

$$g(t) = [\ g_1(t:s_1)\quad g_1(t:s_2)\quad \ldots\quad g_1(t:s_1)\ ]$$
$$[\ g_2(t:s_1)\quad g_2(t:s_2)\quad \ldots\quad g_2(t:s_1)\ ]$$
$$[\ldots]$$
$$[\ldots]$$
$$[\ldots]$$
$$[\ g_m(t:s_1)\quad g_m(t:s_2)\quad \ldots\quad g_m(t:s_1)\ ].$$

The spectral density matrix of x(t) 16 is defined as $S_{xx}(f) = (1/T)G^*(f)W_{ss}(e^{j2pfT})G^T(f)$ where the superscript * denotes the complex conjugation of G, the M×1 matrix function G($f$) is the Fourier transform of the M×1 matrix function g(t), and $W_{ss}(e^{j2pfT})$ is the z-transform of an autocorrelation matrix $R_{ss}[k]$ that characterizes the discrete stochastic process c[n] as follows:

$$R_{ss}[k] = \begin{cases} \Pi P^k & \text{if } k = 0 \\ (P^t)^{-k}\Pi & \text{if } k < 0 \end{cases}$$

where $\Pi$ is a diagonal matrix with the stationary probabilities of the MC as entries, and the index k represents discretized time.

The z-transform is based on the eigendecomposition of P. TPMs always have one eigenvalue equal to 1 and all the other eigenvalues having magnitudes less than or equal to 1. Eigenvalues of magnitude 1 result in $\delta$-functions in the spectrum $W_{ss}(e^{j2\pi fT})$ and correspond to pure tones such that the spectral density matrix $S_{xx}(f)$ consists of continuous and discrete components defined as follows:

$$S_{xx}(f) = S^c_{xx}(f) + \Sigma_k \delta(f - f^d_k) S^d_{xxk}.$$

The discrete spectral component reflects the fact that the interference signals are triggered by discrete events that occur at periodic clock intervals. The continuous spectral component results from the randomness of these events.

The present invention requires computing the propagation of a large number of stochastic processes through a complex linear system. The number of matrix solutions, however, is determined only by the number of the points of interest, and does not depend of the number of switching noise sources. In fact, the computation for spectral power density at the points of interest is similar to the circuit noise analysis problem. Efficient analysis methods based on the adjoint system and reduced-order modeling are employed for propagating the spectral densities of the switching gates through the linear system that models the ensemble of power, ground 22, transistor substrate 24, IC package 26, and board 28.

The present invention requires delimiting the boundary of a switching gate. Every noise signal generated by a switching gate is to be accounted for only once. The contribution of a switching gate is accounted for by modeling the following signals:

(a) the current flowing into the $V_{dd}$ metal supply wire;

(b) the current flowing into the ground 22 supply wire;

(c) the current flowing into the p-type transistor substrate 24;

(d) the current flowing into the n-type transistor substrate 24; and (e) the output voltage waveform.

The output voltage waveform is characterized for each transition, and is used together with extracted interconnect models to determine the currents that flow into the power grid through interconnect wires. In general, currents that flow directly into the substrate are about two orders of magnitude smaller than the currents flowing into the power lines. Thus, in most cases, they can be neglected altogether. In certain applications, however, correct modeling of substrate effect becomes very important, and may constitute the ultimate limitation in isolating the sensitive circuits.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the embodiment may be varied without departing from the spirit of the invention, and the exclusive use of all modifications which come within the scope of the appended claims is reserved.

What is claimed is:

1. A method for evaluating the effect of a plurality of noise sources in a circuit, comprising the step of:

associating each one of a plurality of noise sources in a circuit with a random and discrete sequence of switching events, the sequence being represented as at least one function defined on a state-set of Markov chains wherein each random and discrete sequence of switching events has a plurality of possible values, each one of the possible values being associated with a set of continuous signals, the set of continuous signals comprising waveforms that model currents injected into the circuit by the noise source associated with the random and discrete sequence.

2. The method according to claim 1, wherein said each random and discrete sequence is modulated at each of the switching events with the set of continuous signals corresponding to the value of the random and discrete sequence at the switching event.

3. The method according to claim 2, wherein a matrix representing the spectral power density of the signals resulting from the modulation is transferred through a multi-input and multi-output linear system.

4. The method according to claim 3, wherein the output of the linear system comprises a spectral power density matrix of interference signals at points of interest in the circuit.

5. The method according to claim 4, wherein the multi-input and multi-output linear system represents a platform that supports the circuit, the platform comprising power and ground wires and a substrate.

6. The method according to claim 5, wherein the output of the linear system further comprises a component representing the randomness of the switching events.

7. The method according to claim 6, wherein the circuit comprises digital and analog components.

8. A method for evaluating the effect of a plurality of switching elements in a circuit at points of interest, comprising the steps of:

transferring through a linear system an input matrix comprising a spectral power density of continuous stochastic processes that model interference noise generated by a plurality of switching elements in a circuit; and generating an output matrix comprising a spectral power density of an interference signal at each one of a plurality of points of interest in the circuit.

9. The method according to claim 8, wherein the continuous stochastic processes modulate a plurality of random and discrete sequence of switching events with a set of continuous signals.

10. The method according to claim 9, wherein each one of the random and discrete sequences is associated with one switching element, each sequence representing switching events for the corresponding switching element, each sequence having a plurality of possible values, and each sequence being represented as a function defined on a state-set of Markov chains.

11. The method according to claim 10, wherein the sets of continuous signals comprise waveforms representing interference noise generated by each of the switching elements at each one of the plurality of possible values of the corresponding random and discrete sequence.

12. The method according to claim 11, wherein each one of the random and discrete sequences is modulated with one set of continuous waveforms, wherein the set modulating the random and discrete sequence comprises waveforms representing the interference noise generated by the switching element associated with the corresponding random and discrete sequence when the sequence is at one of the plurality of possible values.

13. The method according to claim 12, wherein the linear system comprises a number of inputs equal to the number of the switching elements and a number of outputs equal to the number of the points of interest, and represents a platform supporting the circuit, the platform comprising power and ground wires and a substrate.

14. The method according to claim 13, wherein the output matrix comprises correlations between the interference signals at the points of interest.

15. The method according to claim 14, wherein the interference noise generated by each one of the switching elements comprises currents injected into the power and ground wires and the substrate by the corresponding switching element at each of the switching events.

16. The method according to claim 15, wherein the interference noise generated by each of the switching elements further comprises currents injected by the corresponding switching element into a transistor substrate at each of the switching events.

17. The method according to claim 16, wherein the platform further comprises a transistor substrate, an IC package and a circuit board.

18. A simulator for evaluating the effect of a plurality of noise sources in a circuit at points of interest, comprising:
   an associater that associates each one of a plurality of noise sources in a circuit with a random and discrete sequence of switching events, the sequence representing noise generating events each having a plurality of possible values; and
   a multi-input and multi-output linear system through which signals resulting from modulation of each random and discrete sequence with a set of continuous signals are transferred, wherein the set of continuous signals comprises waveforms representing currents injected into power and ground wires and into a chip substrate by the noise source associated with the corresponding random and discrete sequence when the sequence is at one of the plurality of possible values.

19. The simulator according to claim 18, wherein the linear system represents a platform that supports the circuit.

20. The simulator according to claim 19, wherein an output of the linear system comprises the spectral power density of an interference signal at each of the points of interest and correlations between the interference signals.

21. A method for evaluating the effect of a plurality of noise sources at points of interest in a circuit, comprising the step of:
   associating each one of a plurality of noise sources in a circuit with a discrete stochastic process representing noise generating events, wherein each one of the processes associated with the noise sources is modeled as at least one function on a state-set of a single Markov chain
   wherein each one of the discrete stochastic processes is modulated at each one of the noise generating events with a set of continuous signals to produce a corresponding continuous stochastic process for each of the noise sources, wherein the set of continuous signals comprises waveforms representing currents injected into power and ground wires and into a substrate by the noise source associated with the random and discrete sequence with which the set is modulated.

22. The method according to claim 21, wherein the spectral power density of each of the continuous stochastic processes is computed and transferred through a linear system representing a platform that supports the circuit.

23. The method according to claim 22, wherein the output of the linear system comprises the spectral power density of interference signals at points of interest in the circuit.

* * * * *